United States Patent [19]
Xiang et al.

[11] Patent Number: 6,015,752
[45] Date of Patent: Jan. 18, 2000

[54] ELEVATED SALICIDE TECHNOLOGY

[75] Inventors: Qi Xiang, Santa Clara; Shekhar Pramanick, Fremont, both of Calif.

[73] Assignee: Advanced Micro Devices, Inc., Sunnyvale, Calif.

[21] Appl. No.: 09/106,769

[22] Filed: Jun. 30, 1998

[51] Int. Cl.$^7$ .................. H01L 21/283; H01L 21/288
[52] U.S. Cl. .................. 438/655; 438/674; 438/678; 438/682
[58] Field of Search ..................... 438/655, 683, 438/592, 542; 427/88; 257/649, 66; 29/590

[56] References Cited

U.S. PATENT DOCUMENTS

| | | | |
|---|---|---|---|
| 4,297,393 | 10/1981 | Denning et al. | 427/88 |
| 4,663,820 | 5/1987 | Ionescu | 29/590 |
| 4,692,349 | 9/1987 | Georgiou et al. | 438/655 |
| 4,835,112 | 5/1989 | Pfiester et al. | 438/305 |
| 5,608,232 | 3/1997 | Yamazaki et al. | 257/66 |
| 5,623,161 | 4/1997 | Fukuda et al. | 257/649 |
| 5,721,175 | 2/1998 | Kunishima et al. | 438/542 |
| 5,780,362 | 7/1998 | Wang et al. | 438/683 |
| 5,861,340 | 1/1999 | Bai et al. | 438/592 |

OTHER PUBLICATIONS

S.P, Murarka, "Silicides for VLSI Applications", Thermodynamic Considerations, Academic Press, 1983, p. 82.

L.A. Clevenger et al., "Nucleation–limited phase selection during reactions in nickel/amorphous–silicon multilayer thin films", J. Appl. Phys. 67(3), 1990, p. 1325.

*Primary Examiner*—Olik Chaudhuri
*Assistant Examiner*—Bernard E. Souw

[57] ABSTRACT

Low resistivity metal silicide layers are formed on crystalline source/drain regions and polycrystalline gate electrodes with virtually no consumption of crystalline or polycrystalline silicon, thereby reducing parasitic series resistance without encountering junction leakage. Embodiments include selectively depositing a layer of nickel at a temperature less than about 280° C. on the source/drain region and gate electrode, and then depositing a layer of amorphous silicon at a temperature below about 280° C. thereon. An initial low temperature annealing is conducted, e.g., at about 180° C. to about 280° C., to react the amorphous silicon and nickel to form an upwardly grown layer of amorphous nickel silicide on the source/drain region and gate electrode with virtually no consumption of underlying silicon. Unreacted amorphous silicon is then removed, as by wet etching, and a second high temperature annealing is conducted to convert the high resistivity amorphous nickel silicide to low resistivity polycrystalline nickel silicide.

18 Claims, 3 Drawing Sheets

ELEVATED SALICIDE TECHNOLOGY

TECHNICAL FIELD

The present invention relates to semiconductor manufacturing, particularly to self-aligned silicide (salicide) technology. The present invention is particularly applicable to manufacturing ultra large scale integrated circuit (ULSI) systems having features in the deep-submicron range.

BACKGROUND ART

Deep-submicron scaling required for ULSI systems dominates design considerations in the microelectronics industry. As the gate electrode length is scaled down, the source and drain junctions must be scaled down accordingly, to suppress the so-called short channel effects (SCE) which degrade performance of scale-downed devices. A major problem related to complementary metal oxide silicon (CMOS) scaling is the undesirable increase in parasitic resistance. As the source/drain junction depth ($X_j$) and polycrystalline silicon line width are scaled into the deep-submicron range, parasitic series resistances of the source/drain diffusion layers and polysilicon gate electrodes increase. A conventional approach to the increase in parasitic series resistances of the source/drain diffusion layers and the polysilicon gate electrodes involves salicide technology which comprises forming a layer of titanium disilicide ($TiSi_2$) on the source/drain regions and gate electrode.

Conventional salicide technology employing $TiSi_2$ for reducing parasitic series resistance has proven problematic, particularly as design rules plunge into the deep-submicron range, e.g., about 0.18 microns and under. For example, in forming a thin $TiSi_2$ layer, silicide agglomeration occurs during silicide annealing to effect a phase change from the high resistivity C49 form to the low resistivity C54 form. Such agglomeration further increases the sheet resistance of the silicide film. Moreover, the formation of a thick silicide layer causes a high junction leakage current and low reliability, particularly when forming ultra shallow junctions, e.g., at an $X_j$ of less than about 800 Å. The formation of a thick silicicde consumes crystalline silicon from the underlying semiconductor substrate such that the thick silicide layer approaches and even shorts the ultra-shallow junction, thereby generating a high junction leakage current.

Another problem attendant upon conventional $TiSi_2$ technology is the well-known increase in sheet resistance as the line width narrows. The parasitic series resistances of source/drain regions and gate electrodes are a major cause of device performance degradation and are emerging as one of the severest impediments to device scaling.

In copending application Ser. No. 09/112,156, filed on Jul. 9, 1998, elevated salicide methodology is disclosed wherein crystalline silicon consumption in the substrate and polycrystalline consumption in the gate electrode upon forming metal silicide layers is replenished.

There exists a need for salicide technology which enables a reduction in the parasitic sheet resistance without generating a high leakage current. There exists a particular need for salicide methodology which avoids the generation of a high leakage current in semiconductor devices having a design rule in the deep-submicron range, e.g., a design rule less than about 0.18 microns.

DISCLOSURE OF THE INVENTION

An advantage of the present invention is a method of manufacturing a semiconductor device having an elevated salicide structure formed with substantially no consumption of silicon from the underlying substrate or gate electrode.

Another advantage of the present invention is a method of manufacturing a semiconductor device having a design rule less than about 0.18 microns with source/drain regions having an ultra shallow junction less than about 800 Å utilizing an elevated salicide technology, thereby avoiding any substantial consumption of silicon from the substrate and gate electrode and, hence, avoiding the generation of high leakage current while reducing parasitic series resistance.

Additional advantages and other features of the present invention will be set forth in part in the description which follows, and in part will become apparent to those having ordinary skill in the art upon examination of the following or may be learned by practice of the present invention. The advantages of the present invention may be realized and attained as particularly pointed out in the appended claims.

According to the present invention, the foregoing and other objects are achieved in part by a method of manufacturing a semiconductor device, the method comprising: forming a structure comprising: a crystalline silicon substrate; source/drain regions in the substrate with a channel region therebetween; a gate dielectric layer on the substrate over the channel region; a polycrystalline silicon gate electrode, having an upper surface and side surfaces, on the gate dielectric layer; and a dielectric sidewall spacer on each side surface of the gate electrode, leaving a portion of the source/drain regions exposed; selectively depositing a metal layer on the exposed portions of the source/drain regions and on the upper surface of the gate electrode with substantially no metal depositing on the dielectric sidewall spacers; depositing a layer of amorphous silicon on the deposited metal layers and sidewall spacers; and heating to react the amorphous silicon with the metal to form a metal silicide layer on the exposed portions of the source/drain regions and on the upper surface of the gate electrode.

Another aspect of the present invention is a method of manufacturing a semiconductor device, the method comprising: forming a structure comprising: a crystalline silicon substrate; source/drain regions in the substrate with a channel region therebetween; a gate dielectric layer on the substrate over the channel region; a polycrystalline silicon gate electrode, having an upper surface and side surfaces, on the gate dielectric layer; and a dielectric sidewall spacer on each side surface of the gate electrode, leaving a portion of the source/drain regions exposed; selectively depositing a metal layer on the exposed portions of the source/drain regions and on the upper surface of the gate electrode with substantially no metal depositing on the dielectric sidewall spacers; selectively depositing a layer of nickel by electroless plating on the exposed portions of the source/drain regions and on the upper surface of the gate dielectric layer at a temperature less than about 280° C.; depositing a layer of amorphous silicon by low temperature chemical vapor deposition at a temperature less than about: 280° C.; heating at a temperature of about 180° C. to less than about 280° C. to react the nickel with the amorphous silicon upwardly, with substantially no consumption of silicon from the underlying substrate or gate electrode, to form a layer of amorphous nickel silicide on the exposed portions of the source/drain regions and on the gate electrode; removing unreacted amorphous silicon; and heating to convert the layers of amorphous nickel silicide to crystalline nickel silicide having a lower resistivity than the resistivity of amorphous nickel silicide.

Additional advantages of the present invention will become readily apparent to those skilled in the art from the following detailed description, wherein embodiments of the present invention are described simply by way of illustrating the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

DESCRIPTION THE INVENTION

Figure 1:
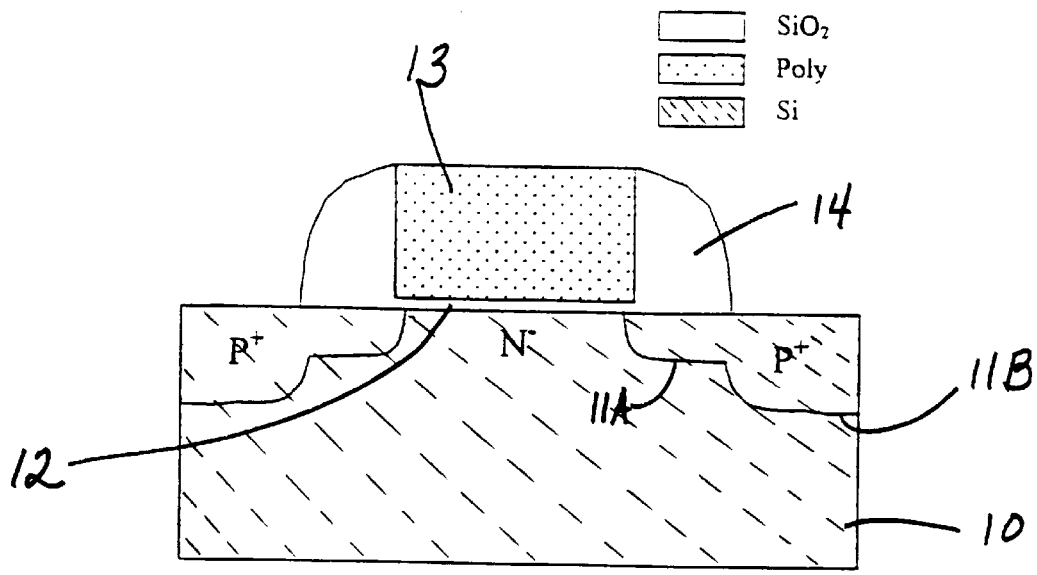
FIGS. 1–6 schematically illustrate sequential phases in accordance with an embodiment of the present invention.

The present invention addresses and solves problems attendant upon conventional salicide technology for parasitic series resistances. Conventional salicide methodology comprises forming a layer of $TiSi_2$ on the source/drain diffusion layers and on the polycrystalline silicon gate electrode, to prevent an increase in the parasitic series resistance due to a scaling down of the source/drain junction depth and polycrystalline silicon line width. However, the formation of a sufficiently thick $TiSi_2$ layer on the source/drain regions and on the gate electrode to reduce parasitic series resistances generates a leakage current, in that the $TiSi_2$ layer on the source/drain regions approaches and frequently overlaps the shallow junction causing an increase in junction leakage current. If a thin $TiSi_2$ layer is employed, a high sheet resistance would result. Moreover, $TiSi_2$ undergoes agglomeration upon annealing from the high resistivity C49 phase to the low resistivity C54 phase, thereby further increasing sheet resistance. $TiSi_2$ also increases in sheet resistance as the line width is narrowed.

The present invention addresses and solves such problems by providing an elevated salicide technology for source/drain regions and gate electrodes for lowering the parasitic series resistance. In accordance with various embodiments of the present invention, a silicide layer is formed on the source/drain regions and gate electrode with no or virtually no consumption of silicon from the underlying source/drain regions or gate electrode, thereby significantly improving the junction leakage and reliability of ultra-shallow junctions. The present invention enjoys utility in manufacturing any of various types of semiconductor devices, particularly advanced deep-submicron CMOS devices, such as 0.1 micron devices with ultra-shallow junctions, e.g., less than about 800 Å. The present invention enables the formation of silicide layers on gate electrodes and source/drain regions having a thickness of about 400 Å to about 1000 Å, wherein the metal silicide layer on the source/drain region is spaced above the shallow junction by a distance no less than the original junction depth.

The present invention enables the formation of silicide layers on gate electrodes and source/drain regions for ultra-shallow source/drain junctions and deep-submicron polycrystalline silicon gate electrodes with no or virtually no consumption of underlying silicon. In accordance with embodiments of the present invention, a metal layer is selectively deposited on the source/drain regions and gate electrode, and an amorphous silicon layer is deposited on the metal layers. A low temperature silicidation reaction is then conducted at a temperature above the temperature at which the metal reacts with the amorphous silicon but below the temperature at which the metal reacts with crystalline or polycrystalline silicon. Accordingly, the metal silicide layer is formed upwardly from the source/drain regions and gate electrode, with no or virtually no consumption of underlying silicon. As such elevated silicide proceeds with no or virtually no substrate silicon consumption, an ultra-shallow junction can be formed without encroachment by the metal silicide layer.

In accordance with the present invention, the substrate typically comprises crystalline silicon, e.g., monocrystalline silicon. The substrate can either be a p-type substrate or an n-type substrate, with the source/drain regions having a conductivity type opposite to that of the substrate.

Sequential phases of a method in accordance with an embodiment of the present invention are schematically illustrated in FIGS. 1–6, wherein similar reference numerals denote similar features. Adverting to FIG. 1, a conventional transistor structure, formed in a conventional manner, comprises substrate 10 doped with an n-type impurity, and source/drain regions comprising a shallow extension region 11A and a heavily doped (HD) region 11B doped with a p-type impurity. The source/drain regions are formed in a conventional manner as, for example, by forming gate electrode layer 13 on semiconductor substrate 10 with gate dielectric layer 12, e.g., a gate oxide such as silicon dioxide, therebetween. Using the gate electrode as a mask, shallow extension regions 11A are formed. Dielectric sidewall spacers 14 are then formed on the side surfaces of gate electrode 13. Dielectric sidewall spacers can comprise any suitable dielectric material, such as silicon dioxide, silicon nitride or a composite of silicon dioxide and silicon nitride. Ion implantation is then conducted, using the gate electrode 13 and sidewall spacers 14 as a mask, to form HD regions 11B.

Figure 2:
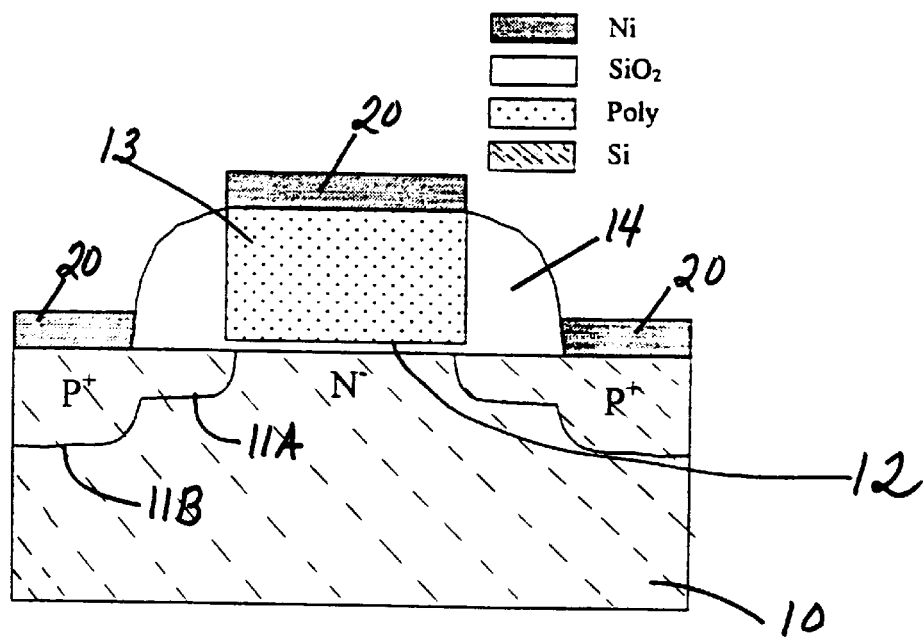

Adverting to FIG. 2, a metal layer 20, such as nickel, is selectively formed on the exposed portions of the source/drain regions, i.e., on the HD regions, and on gate electrode 13. The selective formation of nickel layers 12 can be effected in any conventional manner. Advantageous results have been obtained by selectively depositing nickel layers 20 on the exposed portions of the HD regions 11B and on the upper surface of gate electrode 13, by electroless plating. Such selective electroless plating can be implemented by initially removing any oxide film from the main surface of the semiconductor substrate, i.e., the upper surfaces of the HD regions 11B, and from the upper surface of gate electrode 13, as with a boric oxide etch at room temperature for about 30 seconds. The crystalline and polycrystalline surfaces of the source/drain regions and gate electrode, respectively, are then activated employing a solution of platinum chloride, hydrochloric acid (HCl) and boric oxide, e.g. 0.1 g platinum chloride/liter, 10 milliliters (HCl)/liter and 25 milliliters of a boric oxide/liter. The activated surface is then rinsed for about three minutes employing about 10 milliliters of HCl/liter and 25 milliliters of boric oxide/liter. Electroless deposition is then conducted employing a conventional nickel bath.

Consumption of substrate silicon and gate electrode silicon is avoided by processing at a temperature below that at which nickel reacts with crystalline silicon in the substrate or polycrystalline silicon in the gate electrode, i.e., less than about 280° C. Accordingly, metal layer 20 is formed on the exposed source/drain regions 11B and upper surface of the gate electrode 13 at a temperature less than about 280° C. In conducting electroless nickel deposition, electroless plating is conducted at a temperature less than about 280° C.

Figure 3:
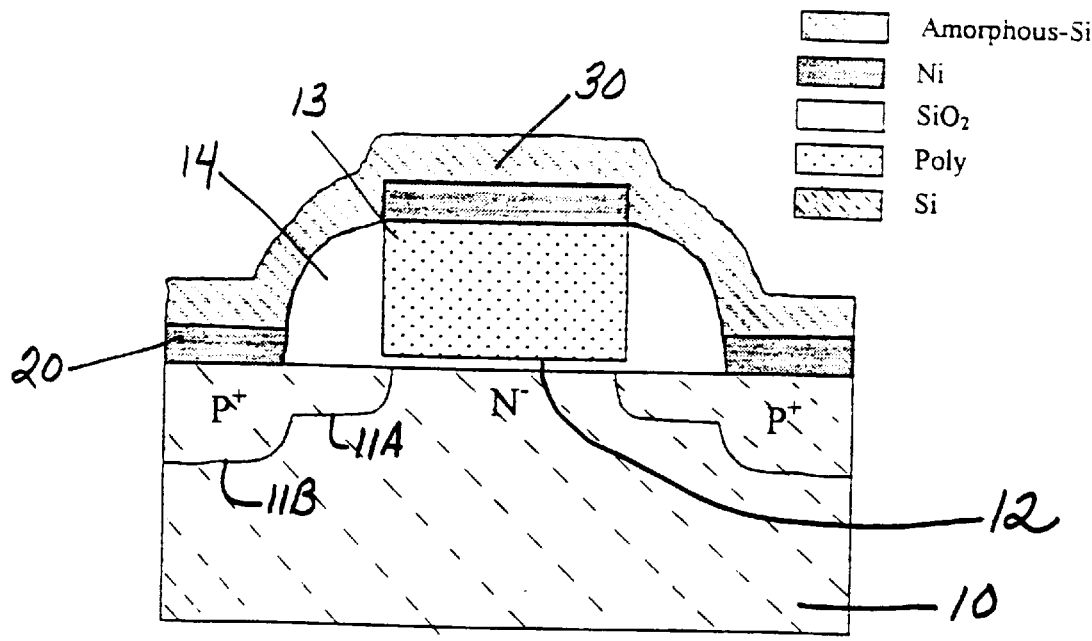
Figure 4:
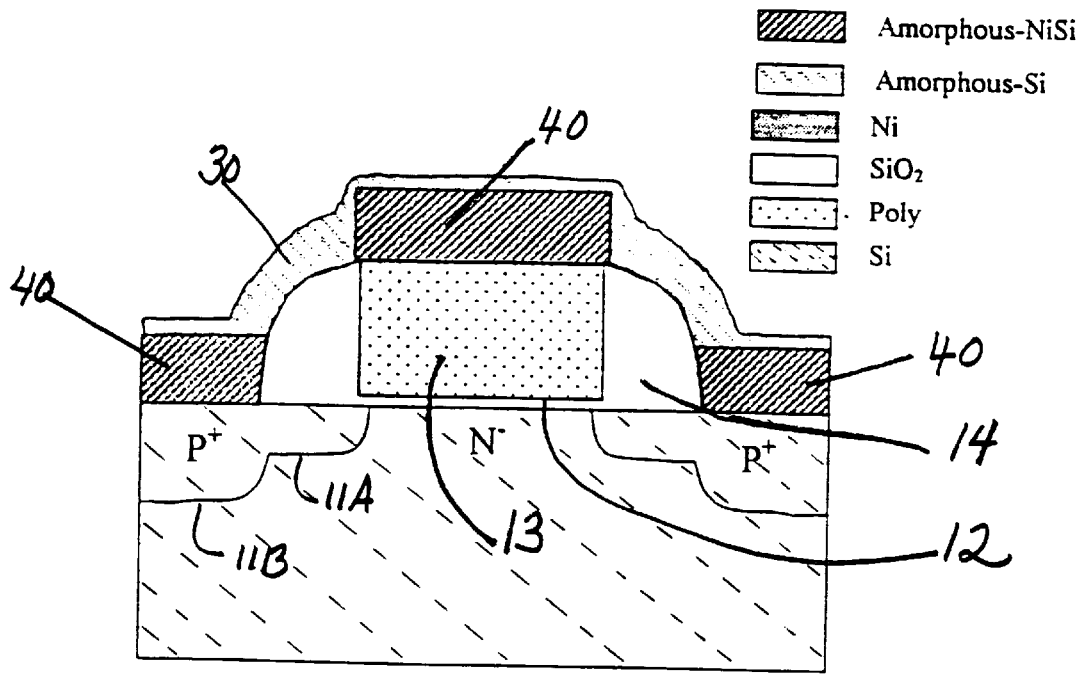

Adverting to FIG. 3, a layer of amorphous silicon 30 is then deposited on nickel layers 20 and on sidewall spacers 14. Amorphous silicon layer 30 is suitably deposited at a temperature less than that at which nickel reacts with crystalline silicon of substrate 10 or polycrystalline silicon of gate electrode 13, i.e., less than about 280° C. It has been found advantageous to deposit amorphous silicon by physical vapor deposition, e.g., sputtering, or low temperature chemical vapor deposition (LTCVD) at a temperature less than about 280° C.

Subsequent to depositing the layer of amorphous silicon 30, an initial low temperature thermal annealing is performed. The initial thermal annealing is conducted at a temperature greater than the temperature at which amorphous silicon reacts with nickel but less than the temperature at which crystalline silicon in substrate 10 or polycrystalline silicon in gate electrode 13 reacts with nickel. Accordingly, the initial low temperature annealing is conducted at a temperature of about 180° C. to less than about 280° C., thereby forming a layer of amorphous nickel silicide on the exposed portions of the source/drain regions 11B and on the upper surface of gate electrode 13. Significantly, the layers of amorphous nickel silicide 40 are formed by reaction of the nickel with the overlying amorphous silicon and, hence, the formation of amorphous nickel silicide layers 40 proceeds upwardly, i.e., it is elevated from the source/drain regions 11B and gate electrode 13. Thus, amorphous nickel suicide layers 40 grow upwardly with no or virtually no consumption of monocrystalline silicon from the semiconductor substrate 10 or polycrystalline silicon from gate electrode 13.

Figure 5:
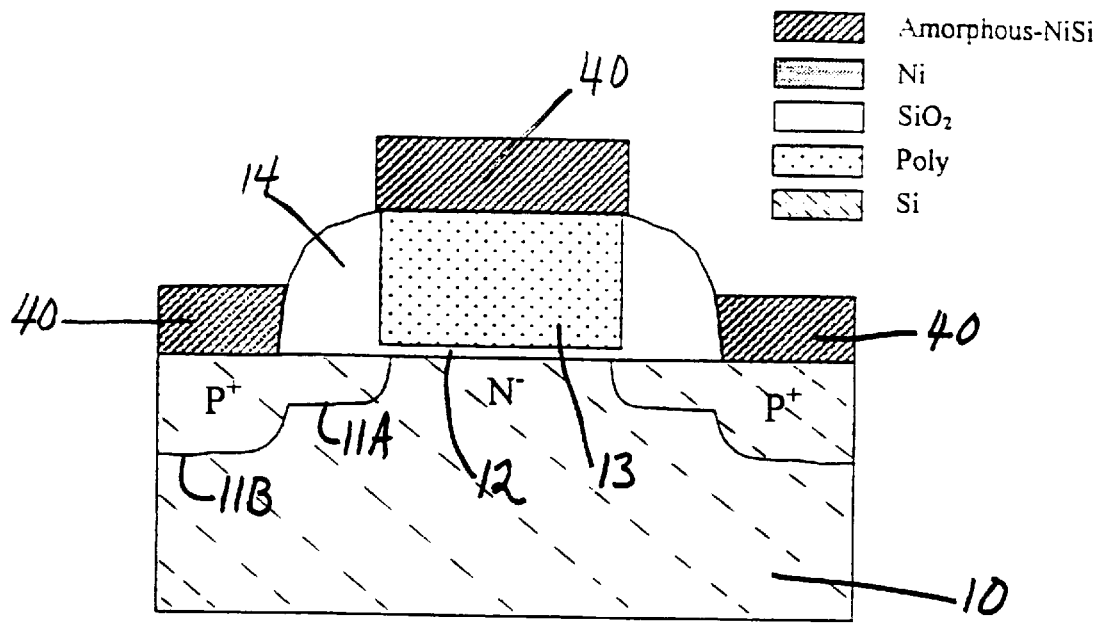
Figure 6:
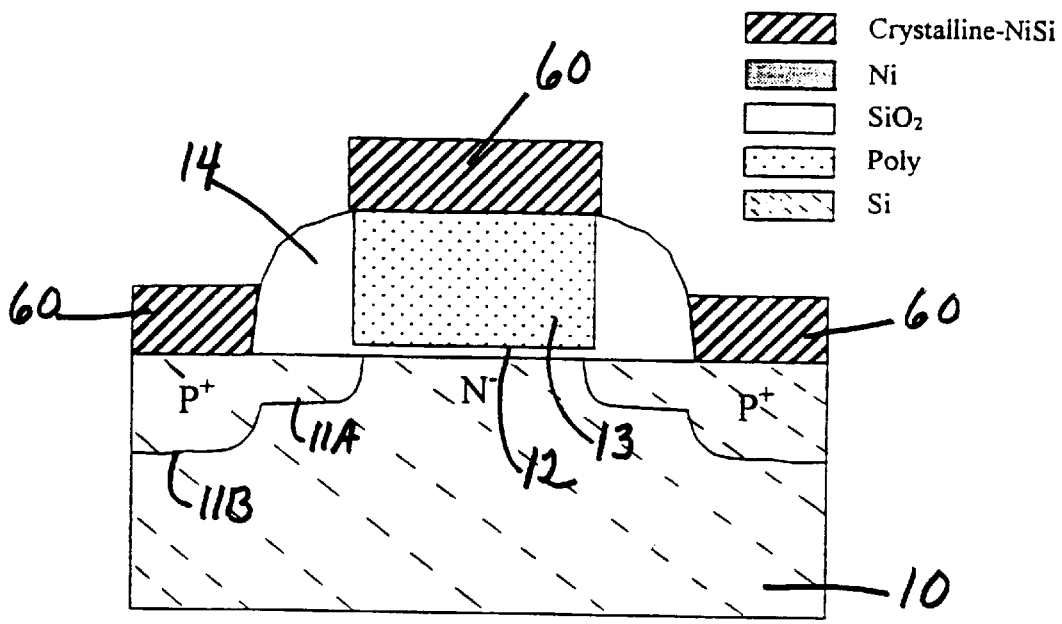

Subsequently, as shown in FIG. 5, any unreacted amorphous silicon is selectively removed from the sidewall spacers 14, as by wet etching employing a solution of ammonia, hydrogen peroxide and water. Subsequent to selectively removing unreacted amorphous silicon, a second thermal annealing is conducted at a relatively high temperature to convert the high resistivity amorphous nickel silicide layers 40 to low resistivity crystalline nickel silicide layer 60. The second high temperature thermal annealing to convert high resistivity amorphous silicide layers 40 to low resistivity crystalline amorphous silicide layers 60 can be conducted at a temperature of about 500° C. to about 700° C., e.g., about 600° C. As shown in FIG. 6, layers of crystalline nickel silicide 60 having a low resistivity are formed at an appropriate thickness, e.g., about 400 Å to about 1000 Å, on the HD regions 11B and on the gate electrode 13, with no or substantially no consumption of silicon from the underlying substrate 10 or gate electrode 13. Subsequent processing is performed in accordance with conventional ULSI fabrication techniques.

In accordance with the present invention, consumption of silicon from the substrate and the gate electrode is avoided or substantially reduced, thereby enabling formation of semiconductor devices having a design rule in the deep-submicron range employing elevated salicide technology to prevent an undesirable increase in parasitic series resistance while, at the same time, avoiding the generation of a leakage current including semiconductor devices having an $X_j$ less than about 800 Å. Accordingly, the present invention achieves the technological advantage of enabling formation of reliable ultra-shallow source/drain junctions to meet the increasing demands for high density and miniaturization. The present invention advantageously enables manufacturing deep-submicron CMOS devices, such as sub 0.1 micron devices, with ultra-shallow junctions less than about 800 Å, even 500 Å and below, without any increased parasitic series resistances and, significantly, without any junction leakage. The present invention is applicable to the manufacture of various types of semiconductor devices, particularly semiconductor devices having a design rule of less than about 0.18 microns.

In the previous description, numerous specific details are set forth, such as specific materials, structures, chemicals, processes, etc., in order to provide a better understanding of the present invention. However, the present invention can be practiced without resorting to the details specifically set forth. In other instances, well-known processing structures have not been described in detail in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, the method comprising:

forming a structure comprising:
a crystalline silicon substrate;
source/drain regions in the substrate with a channel region therebetween;
a gate dielectric layer on the substrate over the channel region;
a polycrystalline silicon gate electrode, having an upper surface and side surfaces, on the gate dielectric layer; and
a dielectric sidewall spacer on each side surface of the gate electrode, leaving a portion of the source/drain regions exposed;

selectively depositing a metal layer on the exposed portions of the source/drain regions and on the upper surface of the gate electrode with substantially no metal depositing on the dielectric sidewall spacers;

depositing a layer of amorphous silicon on the deposited metal layers and sidewall spacers; and heating to react the amorphous silicon with the metal to form a metal silicide layer on the exposed portions of the source/drain regions and on the upper surface of the gate electrode.

2. The method according to claim 1, wherein the substrate comprises monocrystalline silicon.

3. The method according to claim 1, comprising selectively depositing nickel at a temperature less than the temperature at which nickel reacts with crystalline or polycrystalline silicon.

4. The method according to claim 3, comprising electrolessly depositing nickel at a temperature less than about 280° C.

5. The method according to claim 3, comprising depositing amorphous silicon at a temperature less than the temperature at which crystalline or polycrystalline silicon reacts with nickel to form nickel silicide.

6. The method according to claim 5, comprising depositing amorphous silicon by sputtering or low temperature chemical vapor deposition, at a temperature less than about 280° C.

7. The method according to claim 5, comprising heating to react amorphous silicon with nickel to form a layer of amorphous nickel silicide upwardly on the exposed portions of the source/drain regions and upper surface of the gate electrode, at a temperature below that at which a nickel reacts with crystalline or polycrystalline silicon.

8. The method according to claim 7, comprising heating to react amorphous silicon with nickel to form the layer of amorphous nickel silicide at a temperature greater than about 180° C. to a temperature less than about 280° C., wherein the layers of amorphous nickel silicide are formed without any substantial consumption of silicon from the substrate or polycrystalline silicon from the gate electrode.

9. The method according to claim 7, further comprising removing any unreacted amorphous silicon.

10. The method according to claim 9, comprising removing any unreacted amorphous silicon by wet etching.

11. The method according to claim 9, further comprising heating at a second temperature, greater than the first temperature, to convert the amorphous nickel silicide into crystalline nickel silicide having a resistivity less than the resistivity of the amorphous nickel silicide.

12. The method according to claim 11, comprising heating at a temperature of about 450° C. to about 700° C. to convert the amorphous nickel silicide to crystalline nickel silicide.

13. The method according to claim 1, wherein each source/drain region comprises a shallow extension region under the dielectric sidewall spacer and an adjoining heavily doped drain region exposed on the semiconductor substrate.

14. The method according to claim 1, wherein the source/drain regions have a junction depth less than about 800 Å.

15. The method according to claim 11, wherein:
the source/drain regions have a junction depth less than about 800 Å;
the crystalline nickel silicide layer has a thickness of about 400 Å to about 1000 Å; and
the crystalline nickel silicide layer on the source/drain region is spaced apart from the junction depth by a distance no less than the original junction depth.

16. The method according to claim 1, wherein the gate dielectric layer comprises silicon dioxide.

17. The method according to claim 1, wherein the dielectric sidewall spacers comprise silicon dioxide, silicon nitride, or a composite of silicon oxide and silicon nitride.

18. The method according to claim 1, comprising:

selectively depositing nickel by electroless plating on the exposed portions of the source/drain regions and on the upper surface of the gate dielectric layer at a temperature less than about 280° C.;

depositing the layer of amorphous silicon by low temperature chemical vapor deposition at a temperature less than about 280° C.;

heating at a temperature of about 180° C. to less than about 280° C. to react the nickel with the amorphous silicon upwardly, with substantially no consumption of silicon from the substrate or gate electrode, to form a layer of amorphous nickel silicide on the exposed portions of the source/drain regions and the gate electrode;

removing unreacted amorphous silicon; and heating to convert the layers of amorphous nickel silicide to crystalline nickel silicide having a lower resistivity than the resistivity of amorphous nickel silicide.

* * * * *